United States Patent
Zhang et al.

(10) Patent No.: US 9,680,056 B1
(45) Date of Patent: Jun. 13, 2017

(54) ULTRAVIOLET LIGHT-EMITTING DEVICE WITH A HEAVILY DOPED STRAIN-MANAGEMENT INTERLAYER

(71) Applicant: BOLB INC., San Jose, CA (US)

(72) Inventors: Jianping Zhang, San Jose, CA (US); Ling Zhou, San Jose, CA (US)

(73) Assignee: BOLB INC., San Jose, CA (US)

( * ) Notice: Subject to any disclaimer, the term of this patent is extended or adjusted under 35 U.S.C. 154(b) by 0 days.

(21) Appl. No.: 15/205,927

(22) Filed: Jul. 8, 2016

(51) Int. Cl.
H01L 33/12 (2010.01)
H01L 33/00 (2010.01)
H01L 33/32 (2010.01)
H01L 33/06 (2010.01)

(52) U.S. Cl.
CPC .......... *H01L 33/12* (2013.01); *H01L 33/0025* (2013.01); *H01L 33/06* (2013.01); *H01L 33/32* (2013.01)

(58) Field of Classification Search
CPC ......... H01L 33/12; H01L 33/06; H01L 33/32; H01L 33/0025
See application file for complete search history.

(56) References Cited

U.S. PATENT DOCUMENTS

| 7,547,925 | B2 | 6/2009 | Wong et al. | |
| 7,682,709 | B1 * | 3/2010 | Davis | C30B 23/02 428/698 |
| 8,569,738 | B2 * | 10/2013 | Kushibe | H01L 33/06 257/14 |
| 2010/0051978 | A1 * | 3/2010 | Katsuno | H01L 33/32 257/94 |
| 2016/0099382 | A1 * | 4/2016 | Liao | H01L 33/06 257/28 |
| 2016/0172534 | A1 * | 6/2016 | Iwata | H01L 33/12 257/13 |

OTHER PUBLICATIONS

C. Q. Chen et al., "AiGaN layers grown on GaN using strain-relief interlayers" Applied Physics Letters, vol. 81, No. 26, Dec. 23, 2002, pp. 4961-4963.
J. P. Zhang et al., "Crack-free thick AiGaN grown on sapphire using AlN/AlGaN superlattices for strain management" Applied Physics Letters, vol. 80, No. 19, May 13, 2002, pp. 3542-3544.
J. P. Zhang et al., "Milliwatt power deep ultraviolet light-emitting diodes over sapphire with emission at 278 nm" Applied Physics Letters, vol. 81, No. 26, Dec. 23, 2002, pp. 4910-4912.

* cited by examiner

*Primary Examiner* — William Coleman
(74) *Attorney, Agent, or Firm* — J.C. Patents

(57) ABSTRACT

A heteroepitaxy strain-management structure for a light emitting device includes: a substrate or template; an epitaxial layer to be epitaxially formed over the substrate or template, wherein a calculated in-plane compressive strain to be exerted by the substrate or template to the epitaxial layer is equal to or larger than 1%; and a heavily doped interlayer inserted in-between the epitaxial layer and the substrate or template; wherein the heavily doped interlayer is of substantially the same material composition as that of the epitaxial layer, with a thickness of 40-400 nm, and doped at a doping level in the range of $5\times10^{19}$ to $5\times10^{20}$ cm$^{-3}$. Also provided is an ultraviolet light emitting device having a heteroepitaxy strain-management structure.

20 Claims, 7 Drawing Sheets

| 74 (p-metal pad) | |
|---|---|
| 72 (p-ohmic metal layer) | |
| 64 (p-contact layer) | |
| 62 (heavily doped interlayer 4) | |
| 50 (p-AlGaN structure) | |
| 40 (MQW) | 84 |
| 38 (n-AlGaN) | 82 |
| 36 (heavily doped interlayer 3) | |
| 34 (n-AlGaN) | |
| 32 (heavily doped interlayer 2) | |
| 24 (AlN) | |
| 22 (heavily doped interlayer 1) | |
| 10 substrate | |

| E2 |
| --- |
| Epitaxial layer made of Layer 2 with free in-plane lattice constant $a_{20}$, whereas $\dfrac{a_{20} - a_{10}}{a_{10}} \geq 1\%$ |
| HDIL Heavily doped Interlayer |
| S1 Substrate or template made of Layer 1 with free in-plane lattice constant $a_{10}$ |

FIG. 1

| 74 (p-metal pad) |
| --- |
| 72 (p-ohmic metal layer) |
| 64 (p-contact layer) |
| 62 (heavily doped interlayer 4) |
| 50 (p-AlGaN structure) |
| 40 (MQW) |
| 38 (n-AlGaN) |
| 36 (heavily doped interlayer 3) |
| 34 (n-AlGaN) |
| 32 (heavily doped interlayer 2) |
| 24 (AlN) |
| 22 (heavily doped interlayer 1) |
| 10 substrate |

(with 84 adjacent to 40, and 82 adjacent to 38)

FIG. 3A

ULTRAVIOLET LIGHT-EMITTING DEVICE WITH A HEAVILY DOPED STRAIN-MANAGEMENT INTERLAYER

1. FIELD OF THE INVENTION

The present invention relates in general to semiconductor epitaxial layer structure having two adjacent layers with in-plane compressive strain and a heavily doped strain-management interlayer inserted therebetween, and to a group III nitride ultraviolet light emitting device having a heavily doped strain-management interlayer.

2. DESCRIPTION OF THE RELATED ART

Nitride compound semiconductors such as InN, GaN, AlN, and their ternary and quaternary alloys are viewed as very important optoelectronic materials. Depending on alloy composition, nitride compounds can enable ultraviolet (UV) emissions ranging from 410 nm down to approximately 210 nm. This includes UVA (400-315 nm), UVB (315-280 nm), and part of UVC (280-210 nm) regimes. UVA emissions are leading to revolutions in curing industry, and UVB and UVC emissions owing to their germicidal effect are looking forward to general adoption in food, water, air, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. Being able to offer high UV light intensity & dosage, these UV emitters are ideal point of use light sources for keeping air, food and water fresh and free of microorganisms such as bacteria, viruses and fungi. Furthermore, the light output of these solid state devices can be modulated at frequencies up to a few hundreds of mega-hertz, promising them innovative light sources for covert communication and bio-chemical detection.

Most commercially available UVB and UVC light-emitting diodes (LEDs) adopt laminate structure containing a c-plane ((0001) plane) sapphire or AlN UV transparent substrate, an AlN layer coated over the substrate serving as epitaxy template, and a set of AlN/AlGaN superlattice for dislocation annihilation and strain management. The utilization of AlN template and AlN/AlGaN superlattice enables growth of high-quality high-conductivity n-type AlGaN (n-AlGaN) electron supplier layer, which injects electrons into the following AlGaN-based multiple quantum well (MQW) active-region. On the other side of the MQW active-region are an AlGaN electron-blocking layer, an AlGaN hole injection layer, a hole supplier layer and a p-type contact layer made of GaN or InGaN for ohmic contact formation. The prior art AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

In the prior art UV LED structure, there are at least four severely compressively strained interfaces need to be properly addressed before efficient UV LEDs can be realized. Interface 1 of interest is the sapphire-AlN interface, where the in-plane lattice-mismatch between (0001)-plane sapphire and AlN results in a compressive strain approximately 13.1%. There is a high need to get low-dislocation-density AlN template regardless of the large 13.1% compressive strain. Interface 2 of interest is the AlN—AlGaN interface. As calculated, the compressive strain between an AlN template and an electron supplier n-AlGaN layer varies in-between 0-2.47%, linearly dependent on the Al-composition in the n-AlGaN layer. For UV emissions of wavelengths 270 nm and longer, for examples, 280, 310 and 340 nm, the compressive strain between the n-AlGaN layer and MN template can exceed 1.0%. Compressive strain of this size can lead to dislocation generation and growth surface roughening of the n-AlGaN layer. Interfaces 3 of interest are the AlGaN/AlGaN MQW interfaces. Coherent AlGaN/AlGaN MQW is essential for high efficient UV emission, however, the thus fully strained MQW because of the AlGaN piezoelectric effect can lead to high forward voltage for the UV LEDs. Interface 4 of interest is the p-type AlGaN hole injection layer/p-type contact layer interface. The large compressive strain here can deteriorate p-contact layer surface morphology and conductivity.

In the past, AlN/AlGaN superlattice had been applied to manage strain for AlGaN heteroepitaxy over foreign substrates such as sapphire and GaN (e.g. "Crack-free thick AlGaN grown on sapphire using high temperature AlN/AlGaN superlattice for strain management", J. P. Zhang, et al, Appl. Phys. Lett. 80, 3542 (2002); "AlGaN layers grown on GaN using strain-relief interlayers", C. Q. Chen, et al, Appl. Phys. Lett. 81, 4961 (2002), and U.S. Pat. No. 7,547,925.). This superlattice approach to manage strain usually utilizes numerous pairs, for example, more than 5 pairs, or even more than 10 pairs of superlattice to be effective, besides, the superlattice period and bandgap offset have to be large enough to be effective. These constraints make superlattice approach for strain management impractical or inconvenient for some interfaces within a UV light emitter structure.

3. SUMMARY OF THE INVENTION

The present invention discloses an efficient and cost-effective approach for strain, especially compressive strain management, and LED, especially UV LED structures with such strain management of greatly improved material quality and device performance.

One aspect of the present invention provides a heteroepitaxy strain-management structure for a light emitting device. The heteroepitaxy strain-management structure includes:

a substrate or template;

an epitaxial layer to be epitaxially formed over the substrate or template, wherein a calculated in-plane compressive strain to be exerted by the substrate or template to the epitaxial layer is equal to or larger than 1%; and a heavily doped interlayer inserted in-between the epitaxial layer and the substrate or template;

wherein the heavily doped interlayer is of substantially the same material composition as that of the epitaxial layer, with a thickness of 40-400 nm, and doped at a doping level in the range of $5 \times 10^{19}$ to $5 \times 10^{20}$ cm$^{-3}$.

Another aspect of the present invention provides an ultraviolet light emitting device. The ultraviolet light emitting device includes:

a substrate;

an AlN layer formed over the substrate;

an n-AlGaN electron supplier layer formed over the AlN layer;

a light emitting active region formed over the n-AlGaN electron supplier layer;

a p-AlGaN structure formed over the light emitting active region;

a p-contact layer formed over the p-AlGaN structure;

wherein a heavily doped AlN interlayer with a doping level equal to or higher than $5 \times 10^{19}$ cm$^{-3}$ and of a thickness in the range of 40-400 nm is inserted in-between the AlN layer and the substrate.

Still another aspect of the present invention provides an ultraviolet light emitting device.

The ultraviolet light emitting device includes:

a substrate;

an AlN layer formed over the substrate;

an n-AlGaN electron supplier layer formed over the AlN layer;

a light emitting active region formed over the n-AlGaN electron supplier layer;

a p-AlGaN structure formed over the light emitting active region; and a p-contact layer formed over the p-AlGaN structure;

wherein a first heavily doped n-AlGaN or n-AlN interlayer with a doping level equal to or higher than $5 \times 10^{19}$ cm$^{-3}$ and of a thickness in the range of 40-400 nm is inserted in-between the AlN layer and the n-AlGaN electron supplier layer, Al-composition of the first heavily doped n-AlGaN interlayer is equal to or larger than Al-composition of the n-AlGaN electron supplier layer.

4. BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 1 illustrates the strain management principle according to one aspect of the present invention, where the cross sectional schematic drawing shows an in-plane compressive strained material system with a heavily doped interlayer to manage the compressive strain therein.

FIG. 3A illustrates a cross-sectional schematic of a UV LED structure according to one aspect of the present invention, wherein various strain management heavily doped interlayers are incorporated.

Figure 4A:
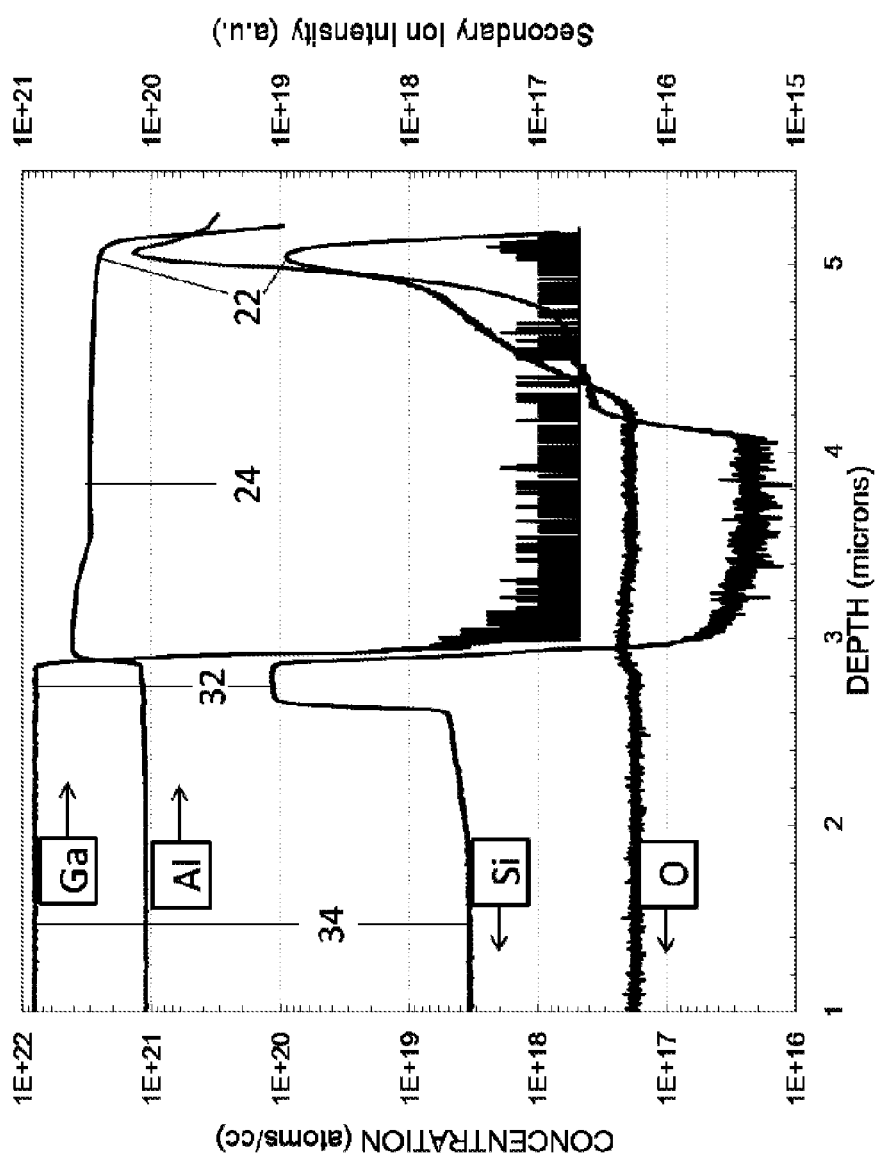

FIG. 4A plots a secondary ion mass spectrometry of part of a UV LED structure made according to an embodiment of the present invention.

Figure 4B:
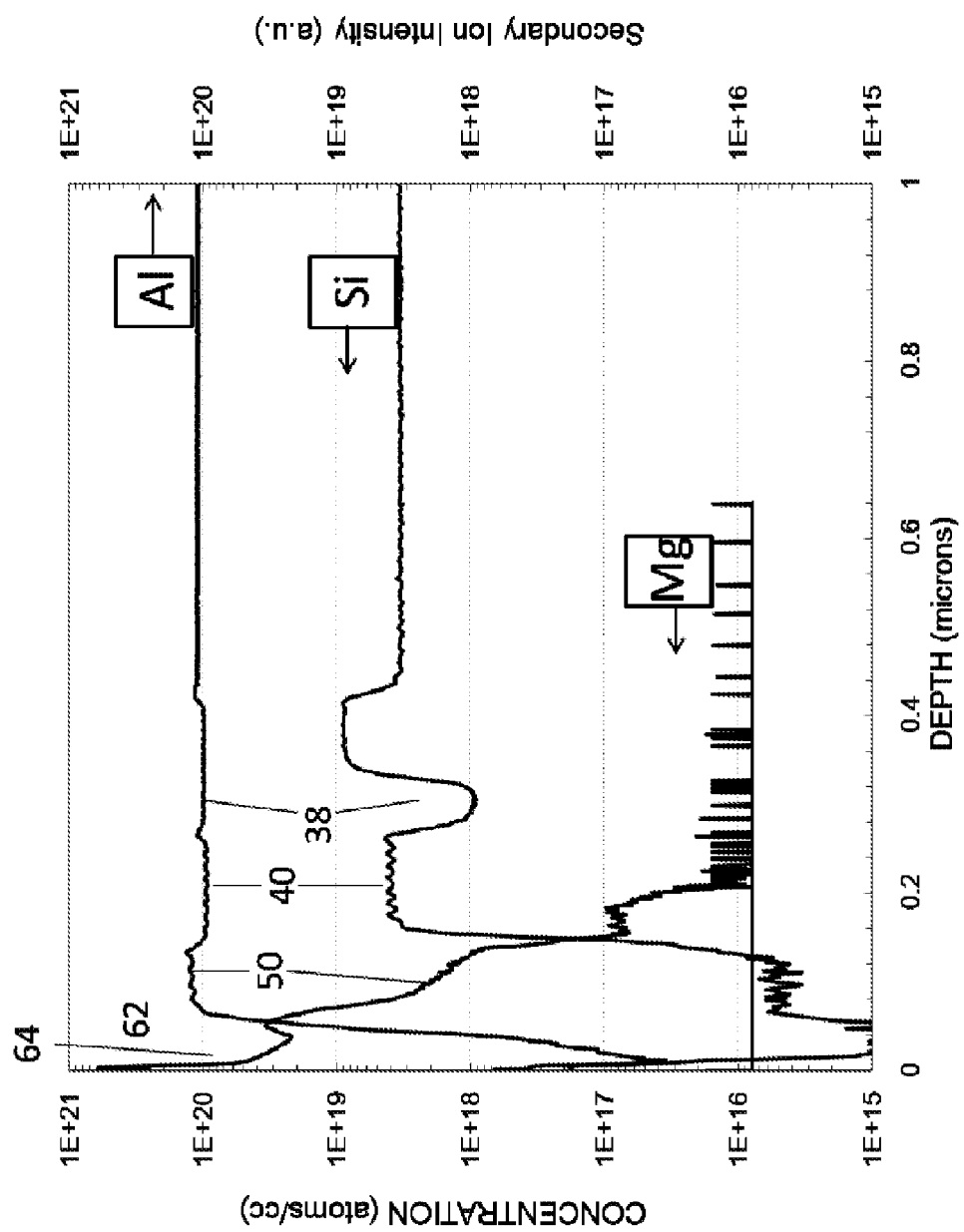

FIG. 4B plots a secondary ion mass spectrometry of part of a UV LED structure made according to an embodiment of the present invention.

Figure 5:
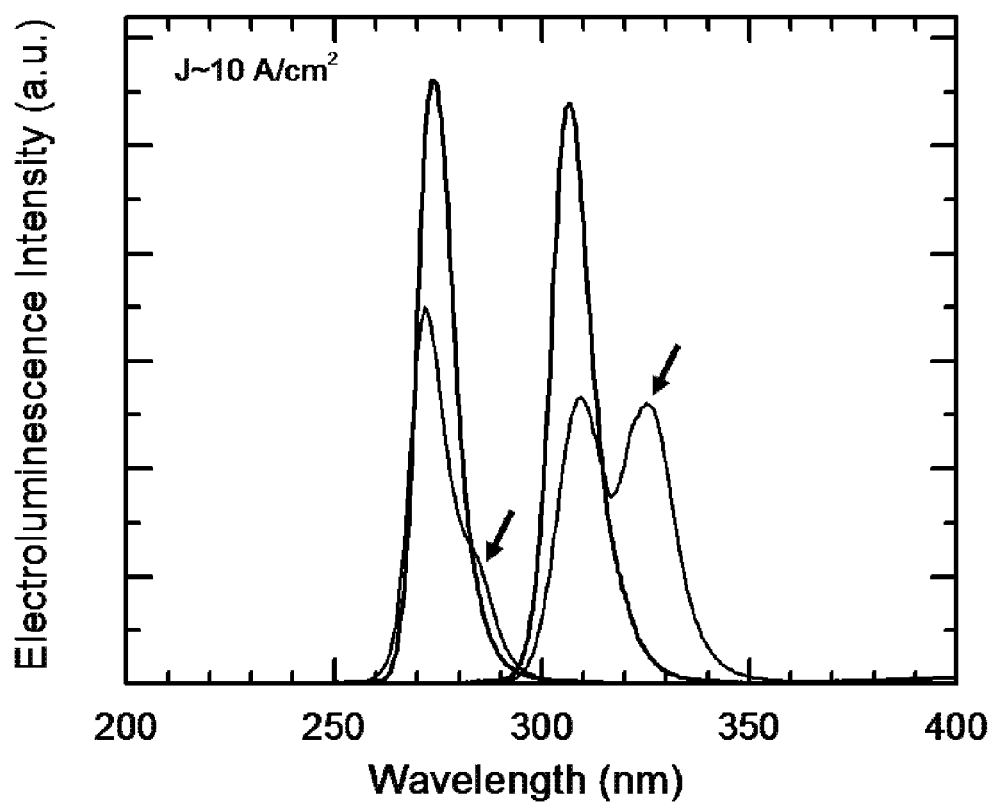

FIG. 5 plots and compares electroluminescence spectra of 275 nm and 307 nm UV LEDs with and without heavily doped interlayer 2 as illustrated in FIG. 3 according to one aspect of the present invention.

5. DETAILED DESCRIPTION OF EMBODIMENTS

The present invention discloses a strain management approach and LED, especially UV LED devices incorporated with compressive strain management with improved quantum efficiencies. Throughout the specification, the term III-nitride or nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$. A III-nitride layer or active-region means that the layer or active-region is made of III-nitride semiconductors.

In the following description, wurtzite c-plane nitride light-emitting devices or structures are used as examples to elucidate the principle and spirit of the present invention. Those of ordinary skills in the field can apply the teachings in this specification to non-c-plane nitride semiconductors, II-VI semiconductors and other lattice-mismatched light-emitting devices or semiconductor devices without creative work.

Illustrated in FIG. 1 is the cross sectional schematic view of a lattice-mismatched material heteroepitaxy structure, used to explain the strain management principle according to one aspect of the present invention. Therein S1 represents a generalized substrate or template or epilayer, with a free in-plane lattice constant $a_{10}$, and E2 stands for an epilayer of a free in-plane lattice constant $a_{20}$ to be epitaxially formed over S1. For UV LED purpose, S1 can be a sapphire or AlN substrate, or an AlN template formed over a suitable substrate (e.g. sapphire, SiC, AlN, Si, et al), or an AlGaN epitaxial layer, and E2 can be an AlN epitaxial layer or an AlGaN epitaxial layer. When $a_{20} > a_{10}$, layer E2 epitaxially formed on S1 will be under in-plane compressive strain. It is to the present inventors' observation that in a lattice-mismatched AlGaN epitaxy structure of calculated in-plane compressive strain $$\varepsilon = \frac{a_{20} - a_{10}}{a_{10}} \geq 1\%,$$

the epitaxial layer will suffer from severe surface roughening in addition to high-density misfit dislocations if the epitaxial layer is directly epitaxially formed on the substrate or template. To mitigate the compressive strain, according to the present invention, a highly doped interlayer (HDIL) is inserted in-between substrate/template S1 and epilayer E2, as shown in FIG. 1. The stain management layer HDIL can be made of the same material as layer E2; it can be also made of different material other than layer E2. In one embodiment, while S1 is a sapphire substrate and E2 is an AlN epilayer, the strain management layer HDIL is a highly doped AlN layer. In another embodiment, while S1 is an AlN template formed over a suitable substrate such as sapphire, silicon carbide or silicon and E2 is an $Al_xGa_{1-x}N$ epilayer, the strain management layer HDIL is a highly doped $Al_yGa_{1-y}N$ layer of the same composition as that of layer E2 (y=x), or of different composition other than that of layer E2, i.e., y≠x, preferably y>x. In still another embodiment, S1 is an $Al_zGa_{1-z}N$ epilayer and E2 is an $Al_xGa_{1-x}N$ epilayer, where x<z, while the strain management layer HDIL is a highly doped $Al_yGa_{1-y}N$ layer of the same or different composition as that of layer E2, preferably 1≥y≥x.

The dopant to the stain management layer HDIL depending on conduction type requirement can be a donor, acceptor, or deep level type of dopant. For example, in a nitride HDIL the dopant can be selected from Si, Ge, Mg, C, Fe, Ni et al. Preferably the dopant is a donor or acceptor type of dopant such as Si, Ge, or Mg. The dopant concentration can be correlated to the strength or size of the compressive strain. For example, for a compressive strain of 1.0% and above, the dopant concentration can be in the range of $5\times10^{19}$ to $5\times10^{20}$ cm$^{-3}$ such as $8\times10^{19}$ to $2\times10^{20}$ cm$^{-3}$. For a compressive strain less than 1.0%, the dopant concentration can be in the range of $8\times10^{18}$ to $3\times10^{19}$ cm$^{-3}$. The thickness of stain management layer HDIL in general lies in the range of 40 to 400 nm, such as 40-80 nm, 50 to 175 nm, or 100-300 nm, depending on the particular embodiments as can be specified more detailed in the following description.

The stain management layer HDIL usually is a single layer with a uniform dopant concentration. If desirable, the dopant concentration can increase or decrease along layer growth direction within the stain management layer HDIL. The stain management layer HDIL usually is formed directly on S1, while layer E2 usually is formed directly on the stain management layer HDIL. If desirable, other suitable layer can be inserted between the stain management layer HDIL and S1, or between the stain management layer HDIL and layer E2, for example a nucleation layer can be inserted between the stain management layer HDIL and substrate S1. The stain management layer HDIL can be inserted between various layer pairs at various locations in a light emitting device so as to reduce the compressive strain of the layer pair as described below in more details.

Figure 2A:
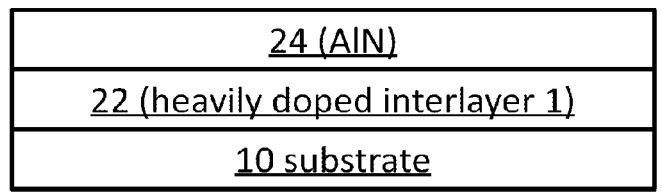
FIG. 2A illustrates an embodiment according to one aspect of the present invention, wherein an AlN epilayer is formed on a foreign substrate with a strain management heavily doped interlayer.

Illustrated in FIG. 2A is the cross-sectional schematic view of a strain management structure according to an embodiment of the present invention. Substrate 10 can be a c-plane (or a-plane) sapphire substrate, and epitaxial layer 24 is an AlN layer serving as a template layer for later layer growth. In view of the otherwise large in-plane compressive strain (13.1%) for AlN layer epitaxially formed on (c-plane) sapphire, inserted in-between layer 24 and substrate 10 is a strain management layer 22, namely a heavily doped interlayer 1. Strain management layer 22 is made of AlN and heavily doped preferably with Si or Ge to a doping level equal to or greater than $5\times10^{19}$ cm$^{-3}$, preferably in the range of $5\times10^{19}$ to $5\times10^{20}$ cm$^{-3}$, such as $8\times10^{19}$ to $2\times10^{20}$ cm$^{-3}$. In general, the thickness of strain management layer 22 lies in the range of 40 to 400 nm, such as 50 to 175 nm, or 70 to 150 nm. Though not shown in FIG. 2A, In-between strain management layer 22 and substrate 10 there may be a nucleation layer made of AlN with a thickness of 15-30 nm.

Strain management layer 22 and layer 24 can be epitaxially formed on substrate 10 via Metal Organic Chemical Vapor Deposition (MOCVD), where trimethylaluminum (TMA), ammonia (NH$_3$) and silane (SiH$_4$) can be used as precursors for aluminum, nitrogen and dopant silicon, respectively. The formation temperature of strain management layer 22 can be 100-300° C. lower than that of layer 24. For example, strain management layer 22 formation temperature can be in the range of 1130-1180° C., whereas the formation temperature of layer 24 can be in the range of 1250-1450° C. The formation temperature of layer 24 can also be higher than 1450° C. if the MOCVD reactor can handle higher temperatures. Strain management layers 22 and layer 24 can also be epitaxially formed over substrate 10 using other epitaxy methods, such as Hydride Vapor Phase Epitaxy (HVPE) and Molecular Beam Epitaxy (MBE).

Figure 2B:
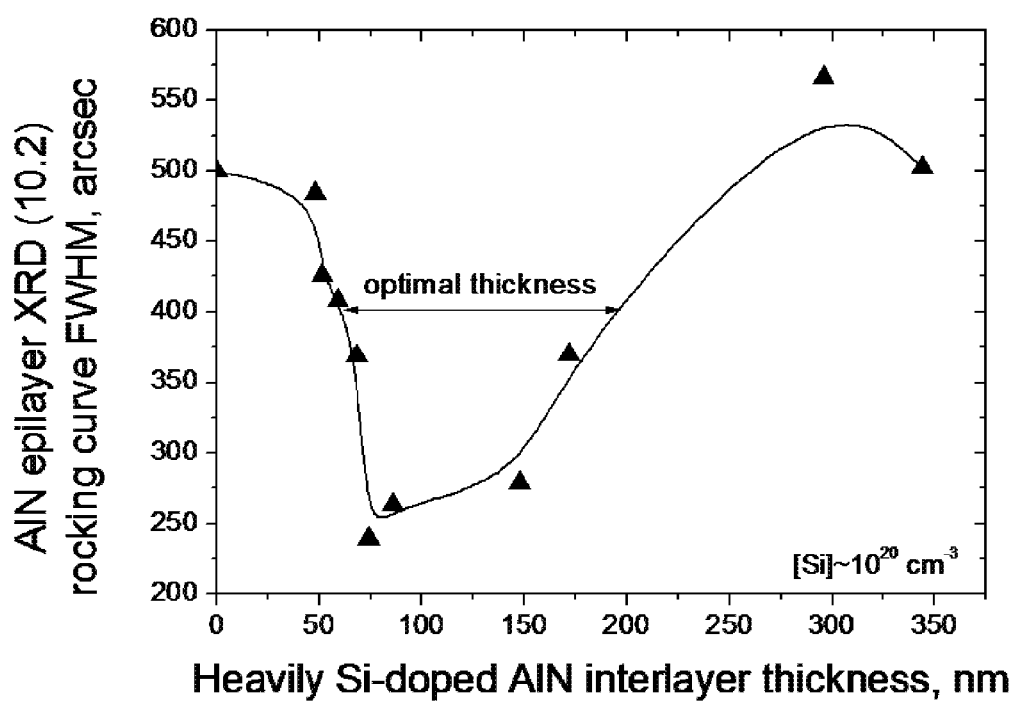
FIG. 2B shows experimental x-ray rocking curve data on AlN epilayers formed on a sapphire substrate with strain management heavily doped interlayers (heavily Si-doped AlN) of different thicknesses, respectively.

Experimentally, high-quality AlN epitaxial layers have been formed over sapphire substrates using the heavily doped interlayer, in accordance with the teachings given in FIG. 1 and related descriptions above and embodiment shown in FIG. 2A. Plotted in FIG. 2B are some AlN epilayers (where the AlN epilayer is directly formed on the heavily doped AlN interlayer) material quality data vs thicknesses of the heavily doped AlN interlayer, whereas the material quality data is represented by (10.2) x-ray rocking curve full width at half maximum (FWHM) data. The AlN epilayer and the heavily doped AlN interlayer used in the structure shown in FIG. 2B were all formed by MOCVD using TMA, NH$_3$, and SiH$_4$ as precursors, where substrate 10 is a c-plane sapphire substrate, layer 24 is a 1.8 μm AlN epilayer, and strain management layer 22 is a heavily Si-doped AlN interlayer of various thicknesses. The dopant concentration here in strain management layer 22 was kept constant at $1\times10^{20}$ cm$^{-3}$, strain management layer 22 and layer 24 were formed via Metal Organic Chemical Vapor Deposition (MOCVD), and the formation temperatures of strain management layer 22 and layer 24 were respectively 1160 and 1320° C. As seen, the (10.2) x-ray rocking curve FWHM of AlN layer (24) is very sensitive to the thickness of the heavily Si-doped AlN interlayer (22). The FWHM value quickly drops from 500 to 239 arcsec when thickness of the heavily Si-doped AlN interlayer (22) increases from 0 to 74 nm, and maintains below 400 arcsec for the thickness less than 175 nm. Since the less the x-ray (10.2) rocking curve FWHM value, the better the material quality, FIG. 2B thus determines that the optimal thickness of the heavily Si-doped AlN interlayer in this study is within 50-175 nm. Further thickening its thickness can result in material quality degradation including the possibility of pits formation on the AlN layer surface. In general, lowering the heavily Si-doped AlN interlayer formation temperature and increasing its Si-doping level can reduce the optimal AlN interlayer thickness.

For UV emission at wavelength of 270-280 nm, an n-$Al_xGa_{1-x}N$ layer of Al-composition (x) of 55%-59% will be applied as electron supplier layer. For 310 and 340 nm LEDs, the electron supplier n-$Al_xGa_{1-x}N$ layers' Al-compositions are in the range of 42%-50% and 30%-35%, respectively. The lattice constant (a(x)) of an $Al_xGa_{1-x}N$ layer can be calculated as $a(x)=xa_{AlN}+(1-x)a_{GaN}$, where $a_{AlN}$=0.3112 nm and $a_{GaN}$=0.3189 nm respectively being the free lattice constant of AlN and GaN. Therefore, the calculated strains (lattice mismatches) as defined previously in this specification for $Al_{0.6}Ga_{0.4}N$ and $Al_{0.59}Ga_{0.41}N$ epilayers on an AlN template are 0.99% and 1.01%, respectively. That is to say, AlGaN layers of Al-compositions less than 60% coherently formed over a thick AlN substrate/template tend to suffer from a calculated in-plane compressive strain equal to or greater than 1.0%. More generally, for a thin $Al_xGa_{1-x}N$ epilayer epitaxially formed over a thick $Al_yGa_{1-y}N$ template, a calculated in-plane compressive strain equal to or greater than 1.0% is likely to be exerted to the $Al_xGa_{1-x}N$ epilayer if y−x>0.4. Here, a thick AlN substrate/template or a thick $Al_yGa_{1-y}N$ template means the thickness thereof is generally larger than 1000 nm, preferably larger than 2000 nm, preferably larger than 3000 nm. A thin $Al_xGa_{1-x}N$ epilayer means the thickness thereof is in the range of a few nanometers to a few thousand nanometers. A substrate or template is usually of thickness greater than the epilayer thickness, serving as an epitaxial base for the epilayer. The compressive strain of this size (≥1.0%) tends to lead to growth surface roughening. According to this aspect of the present invention, UV emitters with electron supplier n-AlGaN layer of Al-composition less than 60% formed over an AlN substrate or a thick AlN template are provided. Also provided is a UV LED structure containing $Al_xGa_{1-x}N/Al_yGa_{1-y}N$ heterostructure where y−x>0.4 with strain management via a heavily doped interlayer formed therebetween.

Throughout this specification, the term "compressive strain" means the calculated in-plane compressive strain as described above unless otherwise specified.

As illustrated in FIG. 3A, an UV LED is provided. Substrate 10 can be a c-plane (or a-plane) sapphire substrate, and epitaxial layer 24 is an AlN layer. In view of the otherwise large in-plane compressive strain (13.1%) for AlN layer epitaxially formed on (c-plane) sapphire, inserted in-between layer 24 and substrate 10 is strain management layer 22, namely a heavily doped interlayer 1. Though not shown in FIG. 3A, In-between strain management layer 22 and substrate 10 there may be a nucleation layer made of AlN to a thickness of 10-20 nm. Strain management layer 22 is made of AlN and heavily doped preferably with Si or Ge to a concentration equal to or greater than $5\times10^{19}$ $cm^{-3}$, preferably in the range of $5\times10^{19}$ to $5\times10^{20}$ $cm^{-3}$. In general, the thickness of strain management layer 22 lies in the range of 40 to 400 nm. As learned from FIG. 2B, the preferred thickness of layer 22 is within 50-175 nm, or 70 to 150 nm. The formation temperature of strain management layer 22 can be 100-300° C. lower than that of layer 24. For example, the layer 22 formation temperatures can be in the range of 1130-1180° C., whereas the formation temperature of layer 24 can be in the range of 1250-1450° C. Since layer 24 serves as the UV emitter's epitaxial template, the thickness of layer 24 is preferably to be larger than 1 u m, for example, to be within 2-3 μm, or larger than 3 μm, to be able to setup the structure quality foundation for the UV emitter. Thick n-AlGaN layer 34 formed over layer 24 is the electron supplier layer, with a thickness greater than 2 μm, for example, 2.5-4.0 μm, to dominate the n-type conductance of the UV emitter. The n-type dopant for layer 34 can be Si or Ge, with a doping level in the range of $1.5-4.0\times10^{18}$ $cm^{-3}$. For UV emissions at 270 nm and longer, the Al-composition of layer 34 is less than 60%. For example, for UV emissions at 270-280 nm, the Al-composition of layer 34 is in the range of 55%-59%, for 310 and 340 nm LEDs, the Al-compositions of layer 34 are in the range of 42%-50% and 30%-35%, respectively. If directly formed on layer 24, layer 34 can suffer from a calculated in-plane compressive strain larger than 1.0%, resulting in undesired growth surface roughness. According to the present invention, a strain management layer 32, namely a heavily doped interlayer 2, is inserted between template layer 24 and electron supplier layer 34 to accommodate the compressive strain. Strain management layer 32 is made of AlGaN with Al-composition equal to or higher than that of electron supplier layer 34. In some embodiment, layer 32 is a heavily doped AlGaN layer with Al-composition equal to that of layer 34; in some embodiment, layer 32 is a heavily doped AlGaN layer with Al-composition higher than that of layer 34, for example 2-5% higher than layer 34 (e.g., if the Al-compositions of layer 34 is 35%, the Al-compositions of layer 32 can be in the range of 37-40%); in some embodiment, layer 32 is a heavily doped MN layer. Layer 32 can be heavily doped preferably with Si or Ge to a concentration equal to or greater than $5\times10^{19}$ $cm^{-3}$, preferably in the range of $5\times10^{19}$ to $5\times10^{20}$ $cm^{-3}$, such as $8\times10^{19}$ to $2\times10^{20}$ $cm^{-3}$. In general, the thickness of strain management layer 32 lies in the range of 40 to 400 nm, for example, in the range of 100-300 nm, such as 120-200 nm. The formation temperature of layer 32 can be equal to or 20-100° C. lower than that of electron supplier layer 34. For example, layer 32 formation temperature can be in the range of 930-1050° C., whereas the formation temperature of layer 34 can be in the range of 1030-1100° C. Even though not shown in FIG. 3A, in-between layers 32 and 34 there may be an undoped AlGaN layer of the same composition as layer 34 with a thickness in the range of 10-100 nm.

Formed on electron supplier layer 34 is a strain management layer 36, namely heavily doped n-AlGaN interlayer 3, which is of thickness 40-400 nm, preferably of thickness 80-300 nm, with n-type dopant of $8\times10^{18}$ to $3\times10^{19}$ $cm^{-3}$. Formed on layer 36 is a lightly doped n-AlGaN layer 38, with thickness of 80-140 nm and doping level of $2\times10^{17}$ to $1\times10^{18}$ $cm^{-3}$. Layer 36 is used to accommodate/alleviate the compressive strain and piezoelectric field within active-region AlGaN/AlGaN MQW 40. Layer 36 is particularly desirable when the calculated compressive strain exerted by quantum barrier to quantum well of active-region MQW 40 is larger than 0.3%. Layers 34, 36, 38 can have substantially the same composition.

Formed over active-region MQW 40 is p-AlGaN structure 50, which can be a single p-AlGaN layer with Al-composition 1.2-1.5 times that of electron supplier layer 34, or a p-type doped such as Mg-doped AlGaN/AlGaN superlattice or multi-layer. Formed over p-AlGaN structure 50 is p-contact layer 64 also made of p-AlGaN, with a strain management layer 62, namely heavily doped interlayer 4, inserted there in-between. Strain management layer 62 is used to accommodate the compressive strain between p-AlGaN structure 50 and p-contact layer 64, since for UVC/UVB LED the Al-composition of p-$Al_yGa_{1-y}$N structure 50 is much higher than that of p-contact layer (p-$Al_xGa_{1-x}$N) 64 (y−x>0.4). Strain management layer 62 is made of AlGaN with Al-composition equal to or higher than that of p-contact layer 64. Strain management layer 62 is p-type heavily doped preferably with Mg to a concentration equal to or greater than $5\times10^{19}$ $cm^{-3}$, preferably in the range of $5\times10^{19}$ to $5\times10^{20}$ $cm^{-3}$, such as $8\times10^{19}$ to $2\times10^{20}$ $cm^{-3}$. In general, the thickness of strain management layer 62 lies in the range of 40 to 80 nm. The formation temperature of strain management layer 62 can be 50-100° C. lower than that of p-contact layer 64. For example, layer 62 formation temperature can be in the range of 800-920° C., whereas the formation temperature of layer 64 can be in the range of 900-1020° C. In some embodiments, layers 62, 64 are made of Mg-doped GaN, or Mg-doped InGaN with In-composition less than 5%.

UV LEDs can be fabricated according to FIG. 3A, by forming p-ohmic contact metal layer 72 on p-contact layer 64, and p-metal pad 74 is formed on layer 72. On the n-contact side, n-ohmic contact metal layer 82 is formed preferably on strain management layer 36, and n-metal pad 84 is formed on layer 82. The n-metal pad 84 and p-metal pad 74 can be made of gold (Au), and p-ohmic contact metal layer 72 can be made of a Ni/Au stack, and n-ohmic contact metal layer 82 can be made of a Ti/Al/Ti/Au stack. The UV LED structure shown in FIG. 3A can be epitaxially formed by MOCVD, using TMA, TMG (trimethylgallium) $NH_3$, $SiH_4$ and $Cp_2Mg$ (bis(cyclopentadienyl) magnesium) as precursors, respectively for Al, Ga, N, Si and Mg sources. A c-plane sapphire substrate (10) is loaded into an MOCVD reactor. Under hydrogen and ammonia gas flow and ambient of pressure 70 mbar, the substrate is heated with a ramping rate approximately 80-100° C./min from room temperature to 1000° C. Then the substrate is cooled down with a ramping rate 60° C./min from 1000° C. to 650° C. for a nucleation AlN layer deposition. The nucleation layer AlN is of thickness 20 nm and formed via opening the TMA and ammonia sources at the same time, with a growth rate of 5 nm/min. Then the substrate with AlN nucleation layer is heated up to 1160° C. with a ramping rate 100° C./min for the heavily Si-doped AlN layer (layer 22) formation. In some embodiment, layer 22 is of 50 nm thickness and doped with Si at a concentration $2 \times 10^{20}$ cm$^{-3}$; In some embodiment, layer 22 is of 50 nm thickness and doped with Si at a concentration $5 \times 10^{19}$ cm$^{-3}$; In still some embodiment, layer 22 is of 70 nm thickness and doped with Si at a concentration $1 \times 10^{20}$ cm$^{-3}$; In still some embodiment, layer 22 is of 150 nm thickness and doped with Si at a concentration $9 \times 10^{19}$ cm$^{-3}$. The growth rate of layer 22 is 10 nm/min. With the completion of layer 22 formation, the wafer of substrate 10 and heavily doped layer 22 is heated up to 1320° C. for thick AlN layer 24 formation, with a growth rate of 1.0-3.0 µm/hour. Sequentially, the wafer is cooled down to 1080-1100° C. for the formation of layer 32, a heavily Si-doped AlGaN. For 270-280 nm UV LEDs, in some embodiment, layer 32 is made of 250 nm-thick $Al_{0.58}Ga_{0.42}N$ doped with Si at $1.5 \times 10^{20}$ cm$^{-3}$; in some embodiment, layer 32 is made of 150 nm-thick $Al_{0.58}Ga_{0.42}N$ doped with Si at $1.0 \times 10^{20}$ cm$^{-3}$; in some embodiment, layer 32 is made of 50 nm-thick AlN doped with Si at $1.1 \times 10^{20}$ cm$^{-3}$. For 310 nm UV LEDs, in some embodiment, layer 32 is made of 200 nm-thick $Al_{0.58}Ga_{0.42}N$ doped with Si at $1.5 \times 10^{20}$ cm$^{-3}$; in some embodiment, layer 32 is made of 250 nm-thick $Al_{0.45}Ga_{0.55}N$ doped with Si at $1.3 \times 10^{20}$ cm$^{-3}$; in some embodiment, layer 32 is made of 50 nm-thick AlN doped with Si at $1.1 \times 10^{20}$ cm$^{-3}$. Following layer 32, at the similar temperature and gas flow conditions (except for the silane flow), a 2.8 µm thick n-AlGaN layer 34 doped with Si at $3.0 \times 10^{18}$ cm$^{-3}$ is formed over layer 32 as the electron supplier layer. Then growth pressure is increased to 108 mbar and the Si doping level is increased to $1.5 \times 10^{19}$ cm$^{-3}$ for the formation of layer 36 with a thickness of 200 nm. Then the Si doping level is decreased to $3 \times 10^{17}$ cm$^{-3}$ for the formation of layer 38 with a thickness of 100 nm. Layers 36, 38 are of similar (same or slightly lower, for example 2-5% lower) Al-composition as that of layer 34. Following layer 38 formed is active-region MQW 40. Then the wafer temperature is reduced to 980-1020° C. for formation of p-AlGaN structure 50, with a Mg-doping level around $1.5-3.0 \times 10^{19}$ cm$^{-3}$. Then the temperature is further reduced to 800-850° C. for formation of layer 62. In some embodiments, layer 62 is a 50 nm-thick Mg-doped $Al_{0.1}Ga_{0.9}N$; in some embodiments, layer 62 is a 40 nm-thick Mg-doped GaN; in some embodiments, layer 62 is a 60 nm-thick Mg-doped GaN; in some embodiments, layer 62 is a 40 nm-thick Mg-doped $In_{0.05}Ga_{0.95}N$. Lowering this temperature can increase Mg-incorporation rate into layer 62, with a targeted Mg concentration in $5 \times 10^{19}$-$5 \times 10^{20}$ cm$^{-3}$. Then the temperature is increased to 920-950° C. for the formation of p-contact layer 64. In some embodiments, layer 64 is a 150 nm-thick Mg-doped GaN; in some embodiments, layer 64 is a 100 nm-thick Mg-doped GaN; in some embodiments, layer 64 is a 50 nm-thick Mg-doped $In_{0.02}Ga_{0.98}N$. The Mg-doping level in layer 64 can be $2.5-5.0 \times 10^{19}$ cm$^{-3}$.

Figure 3B:
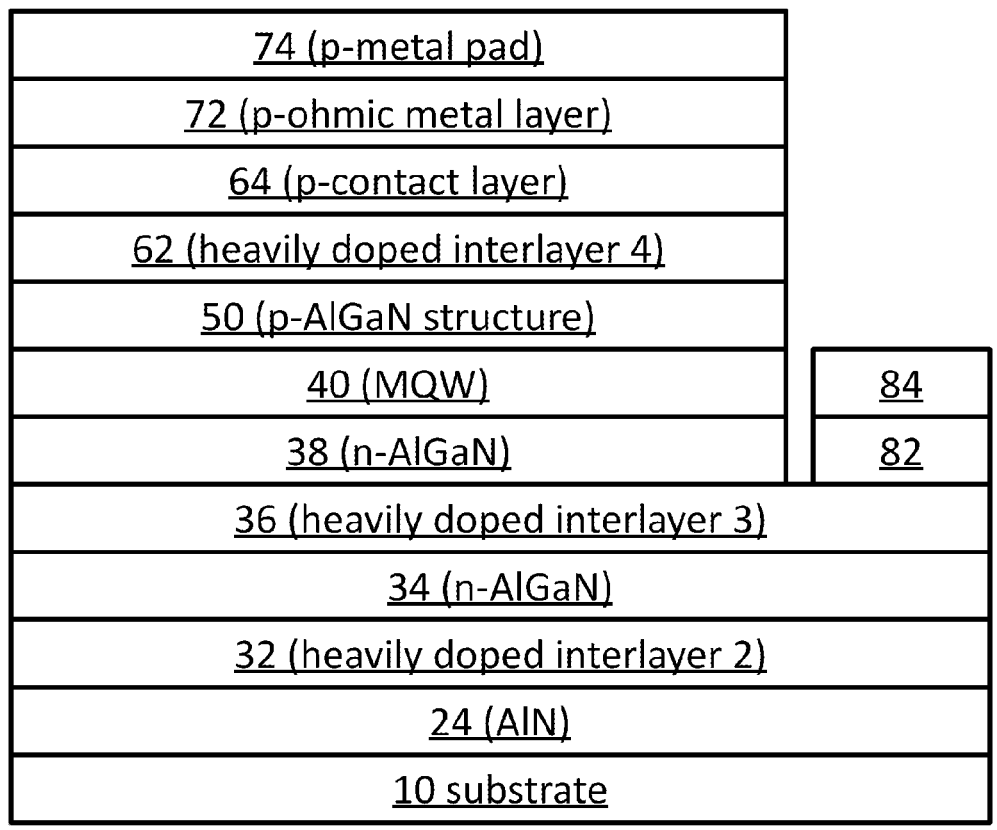
FIG. 3B illustrates a cross-sectional schematic of a UV LED structure according to one aspect of the present invention, wherein various strain management heavily doped interlayers are incorporated.

The UV LED device shown in FIG. 3A includes four heavily doped interlayers, namely layers 22, 32, 36, 62. In other embodiments, some of the heavily doped interlayers may be absent. For example, in an embodiment according to this aspect of the present invention strain management layer 22 may be omitted, as illustrated in FIG. 3B. This is practical if substrate 10 and template layer 24 have a lattice mismatch less than 1%, for example, if template layer 24 is an AlN layer and substrate 10 is an AlN or SiC substrate. In other embodiments, strain management layer 36 can be omitted, especially when the calculated compressive strain exerted by quantum barrier to quantum well of active-region MQW 40 is less than 0.3%, and in still other embodiments, strain management layer 62 can be omitted, especially when the calculated compressive strain exerted to p-contact layer 64 by p-AlGaN structure 50 is less than 1%.

Plotted in FIGS. 4A and 4B are experimental data revealing the heavily doped interlayers in an UV LED made according to FIG. 3A. Here secondary ion mass spectrometric (SIMS) depth profiling data are used to analyze the dopant concentration in various layers of an AlGaN UV LED formed on sapphire substrate made according to FIG. 3A. Referring to FIG. 4A, a strong oxygen (O) impurity peak ($>10^{21}$ cm$^3$) defines the epilayer-substrate interface, where the O impurity comes from the sapphire substrate. In this testing UV LED, a heavily Si-doped AlN interlayer, strain management layer 22, of Si-doping level ~$9 \times 10^{19}$ cm$^{-3}$ and thickness of ~70 nm is formed between an AlN template layer 24 with a thickness of ~2000 nm and a sapphire substrate 10. A heavily doped n-AlGaN interlayer 32 is formed on the AlN template layer 24 and an n-AlGaN electron supplier layer 34 is formed on the heavily doped n-AlGaN interlayer 32. Here the heavily doped n-AlGaN interlayer 32 possesses a thickness of ~250 nm, an Al-composition the same as the n-AlGaN electron supplier layer 34, and a Si-doping about $1.2 \times 10^{20}$ cm$^{-3}$. The n-AlGaN electron supplier layer 34 is of a thickness 2200 nm and an Al-composition of 0.58. A heavily doped n-AlGaN interlayer 36 is formed on the n-AlGaN electron supplier layer 34, formed on the heavily doped interlayer 36 is an active-region MQW 40. A p-AlGaN structure 50 is formed on the active-region MQW 40, a heavily doped p-AlGaN interlayer 62 is formed on the p-AlGaN structure 50, and formed on the heavily doped p-AlGaN interlayer 62 is a p-contact layer 64. Heavily doped interlayers 36 and 62 are revealed in FIG. 4B. The heavily doped n-AlGaN interlayer 36 is of a thickness ~80 nm and an Al-composition of 0.56, and is heavily doped with Si at a doping level of $9 \times 10^{18}$ cm$^{-3}$. The active-region MQW 40 is made with eight 2.5 nm-thick $Al_{0.38}Ga_{0.62}N$ quantum wells separated and confined by nine 10-nm-thick $Al_{0.56}Ga_{0.44}N$ quantum barriers. The heavily doped p-AlGaN interlayer 62 is of a thickness ~40 nm and a Mg-doping level of ~$4 \times 10^{19}$ cm$^{-3}$. The p-contact layer 64 is of a thickness 80 nm and a Mg-doping level of $2 \times 10^{19}$ cm$^{-3}$. In this testing UV LED, the heavily doped p-AlGaN interlayer 62 and the p-contact layer 64 were made of Mg-doped GaN.

Compared in FIG. 5 are some 270 nm and 310 nm UV LEDs' electroluminescence (EL) spectra. The UV LEDs made according to the present invention by incorporating various strain management heavily doped interlayers (refer to FIGS. 3A, 3B, 4A, 4B)) possess stronger optical output power and clean spectra, whereas for the UV LEDs without incorporating the strain management heavily doped interlayers, especially without the strain management layer 32, the EL spectra have an undesirable long-wavelength shoulder (as indicated by arrows in FIG. 5.). The undesirable long-wavelength emission can even dominate the EL spectrum for UVB LEDs (for example, 310 and 340 nm LEDs) without incorporating the strain management heavily doped interlayers. The undesirable long-wavelength shoulder indicates compositional phase separation within the device active-region (MQW 40), resulting from compressive strain induced growth surface roughening of AlGaN layers (MQW 40, and or layers 34, 36 et al.). As seen, the invention as described in the present specification is significant to realize efficient UVB/UVC LEDs.

The principal of the present invention can be readily extended to other semiconductor devices as long as there is strain to mediate. Once the strain size of the epitaxial system is calculated to be large, for example, equal to or larger than 1%, a strain management heavily doped interlayer can be inserted at the interface for strain accommodation.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A heteroepitaxy strain-management structure for a light emitting device, comprising:
   a substrate or template;
   an epitaxial layer to be epitaxially formed over the substrate or template, wherein a calculated in-plane compressive strain to be exerted by the substrate or template to the epitaxial layer is equal to or larger than 1%; and
   a heavily doped interlayer inserted in-between the epitaxial layer and the substrate or template;
   wherein the heavily doped interlayer is of substantially the same material composition as that of the epitaxial layer, with a thickness of 40-400 nm, and doped at a doping level in the range of $5 \times 10^{19}$ to $5 \times 10^{20}$ cm$^{-3}$.

2. The heteroepitaxy strain-management structure according to claim 1, wherein the epitaxial layer is an AlN layer and the substrate is a sapphire substrate, and the heavily doped interlayer is a Si-doped or Ge doped AlN layer with a thickness of 50-175 nm; and
   wherein the light emitting device comprises:
   the sapphire substrate;
   the heavily doped interlayer formed on the sapphire substrate;
   the AlN layer directly formed on the heavily doped interlayer;
   an n-AlGaN electron supplier layer formed over the AlN layer;
   a light emitting active region formed over the n-AlGaN electron supplier layer; and
   a p-AlGaN structure formed over the light emitting active region.

3. The heteroepitaxy strain-management structure according to claim 1, wherein the epitaxial layer is an n-AlGaN electron supplier layer and the template is an AlN layer, and the heavily doped interlayer is a Si-doped or Ge doped AlGaN layer; and
   wherein the light emitting device comprises:
   the template;
   the heavily doped interlayer directly formed on the template;
   the n-AlGaN electron supplier layer formed on the heavily doped interlayer;
   a light emitting active region formed over the n-AlGaN electron supplier layer; and
   a p-AlGaN structure formed over the light emitting active region.

4. An ultraviolet light emitting device comprising:
   a substrate;
   an AlN layer formed over the substrate;
   an n-AlGaN electron supplier layer formed over the AlN layer;
   a light emitting active region formed over the n-AlGaN electron supplier layer;
   a p-AlGaN structure formed over the light emitting active region;
   a p-contact layer formed over the p-AlGaN structure;
   wherein a heavily doped AlN interlayer with a doping level equal to or higher than $5 \times 10^{19}$ cm$^{-3}$ and of a thickness in the range of 40-400 nm is inserted in-between the AlN layer and the substrate, and the AlN layer is directly formed on the heavily doped AlN interlayer.

5. The ultraviolet light emitting device according to claim 4, wherein the heavily doped AlN interlayer is doped with Si or Ge at a doping level in the range of $5 \times 10^{19}$ to $5 \times 10^{20}$ cm$^{-3}$, and of a thickness in the range of 50-175 nm.

6. The ultraviolet light emitting device according to claim 4, wherein the substrate is a c-plane or a-plane sapphire substrate.

7. The ultraviolet light emitting device according to claim 4, wherein a calculated in-plane compressive strain to be exerted to the n-AlGaN electron supplier layer by the AlN layer is equal to or larger than 1.0%, and a heavily doped n-AlGaN or n-AlN interlayer with a doping level in the range of $5 \times 10^{19}$ to $5 \times 10^{20}$ cm$^{-3}$ is inserted in-between the AlN layer and the n-AlGaN electron supplier layer, wherein the n-AlGaN electron supplier layer is directly formed on the heavily doped n-AlGaN or n-AlN interlayer.

8. The ultraviolet light emitting device according to claim 4, wherein a calculated in-plane compressive strain to be exerted to the p-contact layer by the p-AlGaN structure is equal to or larger than 1.0%, a heavily doped p-AlGaN interlayer with a doping level in the range of $5 \times 10^{19}$ to $5 \times 10^{20}$ cm$^{-3}$ is inserted in-between the p-AlGaN structure and the p-contact layer, wherein the p-contact layer is directly formed on the heavily doped p-AlGaN interlayer.

9. The ultraviolet light emitting device according to claim 5, wherein the heavily doped AlN interlayer is of a thickness in the range of 70-150 nm.

10. An ultraviolet light emitting device comprising:
    a substrate;
    an AlN layer formed over the substrate;
    an n-AlGaN electron supplier layer formed over the AlN layer;
    a light emitting active region formed over the n-AlGaN electron supplier layer;
    a p-AlGaN structure formed over the light emitting active region;
    a p-contact layer formed over the p-AlGaN structure;
    wherein a first heavily doped n-AlGaN or n-AlN interlayer with a doping level equal to or higher than $5 \times 10^{19}$ cm$^{-3}$ and of a thickness in the range of 40-400 nm is inserted in-between the AlN layer and the n-AlGaN electron supplier layer, Al-composition of the first heavily doped n-AlGaN interlayer is equal to or larger than Al-composition of the n-AlGaN electron supplier layer, and the n-AlGaN electron supplier layer is directly formed on the first heavily doped n-AlGaN or n-AlN interlayer.

11. The ultraviolet light emitting device according to claim 10, wherein the first heavily doped n-AlGaN or n-AlN interlayer is doped with Si or Ge at a doping level in the range of $5\times10^{19}$ to $5\times10^{20}$ cm$^{-3}$.

12. The ultraviolet light emitting device according to claim 10, wherein a heavily doped AlN interlayer with a doping level equal to or higher than $5\times10^{19}$ cm$^{-3}$ and of a thickness in the range of 40-400 nm is inserted in-between the substrate and the AlN layer.

13. The ultraviolet light emitting device according to claim 10, wherein a second heavily doped n-AlGaN interlayer with a doping level equal to or higher than $5\times10^{19}$ cm$^{-3}$ is inserted in-between the n-AlGaN electron supplier layer and the light emitting active region, Al-composition of the second heavily doped n-AlGaN interlayer is substantially equal to Al-composition of the n-AlGaN electron supplier layer.

14. The ultraviolet light emitting device according to claim 10, wherein a heavily doped p-AlGaN interlayer with a doping level in the range of $5\times10^{19}$ to $5\times10^{20}$ cm$^{-3}$ is inserted in-between the p-AlGaN structure and the p-contact layer.

15. The ultraviolet light emitting device according to claim 11, wherein the first heavily doped n-AlGaN or n-AlN interlayer is an n-AlGaN layer of a thickness in the range of 100-300 nm.

16. The ultraviolet light emitting device according to claim 11, wherein the first heavily doped n-AlGaN or n-AlN interlayer is an n-AlN layer of a thickness in the range of 50-175 nm.

17. The ultraviolet light emitting device according to claim 12, wherein the heavily doped AlN interlayer is doped with Si or Ge at a doping level in the range of $5\times10^{19}$ to $5\times10^{20}$ cm$^{-3}$ and of a thickness in the range of 50-175 nm.

18. The ultraviolet light emitting device according to claim 13, wherein the second heavily doped n-AlGaN interlayer is doped with Si or Ge at a doping level in the range of $5\times10^{19}$ to $5\times10^{20}$ cm$^{-3}$ and of a thickness in the range of 40-400 nm.

19. The ultraviolet light emitting device according to claim 14, wherein the heavily doped p-AlGaN interlayer is doped with Mg at a doping level in the range of $5\times10^{19}$ to $5\times10^{20}$ cm$^{-3}$, of Al-composition equal to or larger than that of the p-contact layer, and of a thickness in the range of 40 to 80 nm.

20. The ultraviolet light emitting device according to claim 18, wherein the second heavily doped n-AlGaN interlayer is of a thickness in the range of 80-200 nm.

* * * * *